(12) United States Patent
Karpov et al.

(10) Patent No.: US 8,026,173 B2
(45) Date of Patent: Sep. 27, 2011

(54) SEMICONDUCTOR STRUCTURE, IN PARTICULAR PHASE CHANGE MEMORY DEVICE HAVING A UNIFORM HEIGHT HEATER

(75) Inventors: Ilya Karpov, Santa Clara, CA (US); Yudong Kim, Cupertino, CA (US); Ming Jin, San Jose, CA (US); Shyam Prasad Teegapuram, Santa Clara, CA (US); Jinwook Lee, San Jose, CA (US)

(73) Assignee: STMicroelectronics S.r.l., Agrate Brianza (IT)

( * ) Notice: Subject to any disclaimer, the term of this patent is extended or adjusted under 35 U.S.C. 154(b) by 691 days.

(21) Appl. No.: 12/048,121

(22) Filed: Mar. 13, 2008

(65) Prior Publication Data

US 2009/0020743 A1    Jan. 22, 2009

Related U.S. Application Data

(63) Continuation-in-part of application No. PCT/EP2006/066316, filed on Sep. 13, 2006.

(30) Foreign Application Priority Data

Sep. 14, 2005 (EP) .................................. 05108414

(51) Int. Cl.
*H01L 21/8239* (2006.01)

(52) U.S. Cl. ........... 438/639; 257/E21.004; 257/E21.52; 438/482; 438/692; 438/696; 438/733

(58) Field of Classification Search ........... 257/E21.004, 257/E21.52; 438/102, 103, 482, 639, 690–692, 438/696, 733
See application file for complete search history.

(56) References Cited

U.S. PATENT DOCUMENTS

| 6,458,708 | B1 | 10/2002 | Jin |
| 2003/0057414 | A1 | 3/2003 | Dalton et al. |
| 2003/0143839 | A1 | 7/2003 | Raaijmakers et al. |
| 2004/0241974 | A1 | 12/2004 | Yun et al. |
| 2004/0256700 | A1 | 12/2004 | Doris et al. |
| 2005/0029504 | A1 | 2/2005 | Karpov |
| 2006/0175597 | A1* | 8/2006 | Happ ............................ 257/2 |

FOREIGN PATENT DOCUMENTS

| EP | 1480273 A2 | 11/2004 |
| WO | 2004003977 A2 | 1/2004 |
| WO | 2006084856 A1 | 8/2006 |

* cited by examiner

*Primary Examiner* — Anh Phung
*Assistant Examiner* — Michael Lulis
(74) *Attorney, Agent, or Firm* — Lisa K. Jorgenson; Robert Iannucci; Seed IP Law Group PLLC

(57) ABSTRACT

A phase change memory formed by a plurality of phase change memory devices having a chalcogenide memory region extending over an own heater. The heaters have all a relatively uniform height. The height uniformity is achieved by forming the heaters within pores in an insulator that includes an etch stop layer and a sacrificial layer. The sacrificial layer is removed through an etching process such as chemical mechanical planarization. Since the etch stop layer may be formed in a repeatable way and is common across all the devices on a wafer, considerable uniformity is achieved in heater height. Heater height uniformity results in more uniformity in programmed memory characteristics.

12 Claims, 4 Drawing Sheets

SEMICONDUCTOR STRUCTURE, IN PARTICULAR PHASE CHANGE MEMORY DEVICE HAVING A UNIFORM HEIGHT HEATER

BACKGROUND OF THE INVENTION

1. Field of the Invention

The present invention relates generally to phase change memories, and in particular to a phase change memory having a more uniform heater and the manufacturing process thereof.

2. Description of the Related Art

Phase change memory devices use phase change materials, i.e., materials that may be electrically switched between a generally amorphous and a generally crystalline state, for electronic memory application. One type of memory element utilizes a phase change material that may be electrically switched between a generally amorphous structural state and a generally crystalline local-order state or among different detectable states of local order across the entire spectrum between the completely amorphous and the completely crystalline state. The state of the phase change materials is also non-volatile in that, when set in either a crystalline, semi-crystalline, amorphous, or semi-amorphous state representing a resistance value, that phase or physical state and the resistance value associated thereto are retained until changed by another programming event. The state is unaffected by removing electrical power.

One problem of this type of memories resides in the fact that, in view of the present manufacturing process, the height of the heater layer varies within a same wafer and from wafer to wafer, thus causing a high level of programming current variation.

This is disadvantageous, since the programmed physical state of the memory cells, and thus the electrical characteristics thereof, depend on the value of the programming current. The variability in the programming current may thus determine errors in storing data, in particular in case of multilevel memories, and thus errors in reading.

BRIEF SUMMARY OF THE INVENTION

One embodiment solves the above indicated problem. One embodiment is a manufacturing process of a semiconductor structure that includes forming an insulator including an etch stop layer, forming a pore in said insulator, depositing a heater in said pore, and planarizing said heater down to said etch stop layer.

One embodiment of the invention is an intermediate semiconductor structure, comprising an insulator including an etch stop layer and a sacrificial layer overlying said etch stop layer, a pore formed in said insulator and said sacrificial layer, and a heater material formed in said pore.

BRIEF DESCRIPTION OF THE SEVERAL VIEWS OF THE DRAWING

One embodiment is now described, purely as a non-limitative example, with reference to the enclosed drawings, wherein.

DETAILED DESCRIPTION OF THE INVENTION

Figure 1:
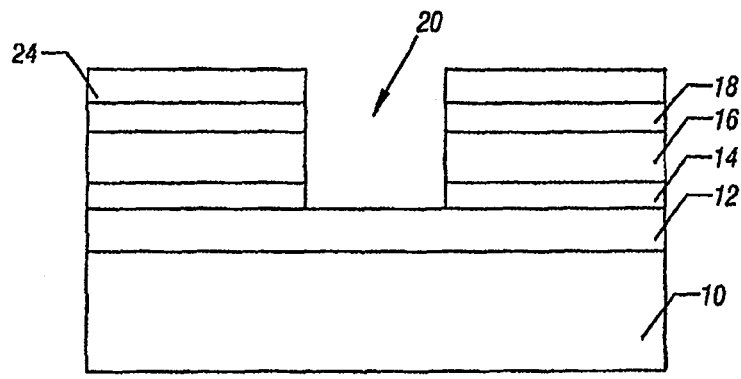
FIGS. 1-7 are enlarged, cross-sectional views at subsequent manufacture stages of a phase change memory, in accordance with one embodiment of the present invention.

Referring to FIG. 1, a wafer comprises a body 10, e.g., including an interlayer dielectric layer over a semiconductor substrate. The interlayer dielectric layer, for example, is oxide. A bottom address line 12 is formed within the interlayer dielectric 10. In one embodiment, the bottom address line 12 is a row line formed of copper made in accordance with conventional techniques.

Then, a stack of layers is formed over the bottom address line 12. In the embodiment of FIG. 1, the stack of layers comprises a first dielectric layer 14 of a first material, a second dielectric layer 16 of a second material, a third dielectric layer 18 of the first material, and a sacrificial dielectric layer 24 of the second material. For example, the first material is nitride and the second material is oxide. Then, a pore 20 is patterned and etched into the stack of layers 14,16, 18, 24.

Figure 2:
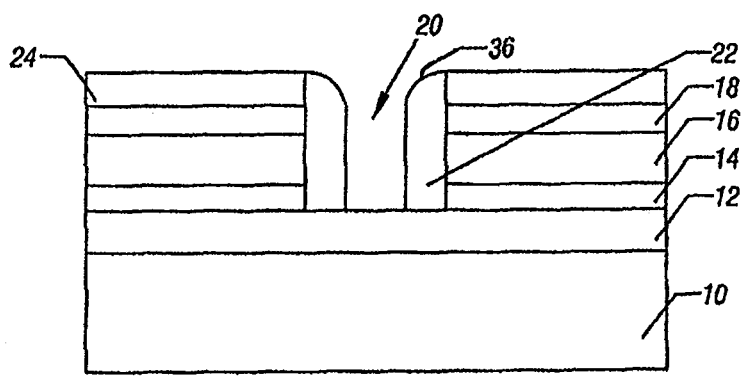

Next, as shown in FIG. 2, a sidewall spacer 22 is formed by a deposition of spacer material followed by an anisotropic etch. The spacer material is, e.g., nitride. The resulting pore 20 has a sub-lithographic width dimension, for example, of 40 to 80 nanometers. Furthermore, the sidewall spacer 22 has a sloping shoulder 36.

Figure 3:
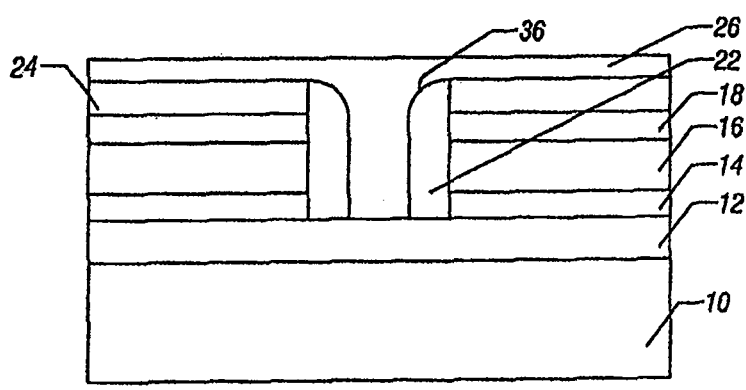

Moving to FIG. 3, a heater material 26 is deposited within the pore 20. The heater material 26 may be any high-resistivity metal such as titanium silicon nitride. Thus, the pore 20 is filled and the stack of layers 14, 16, 18, 24 is covered by the heater material 26.

Figure 4:
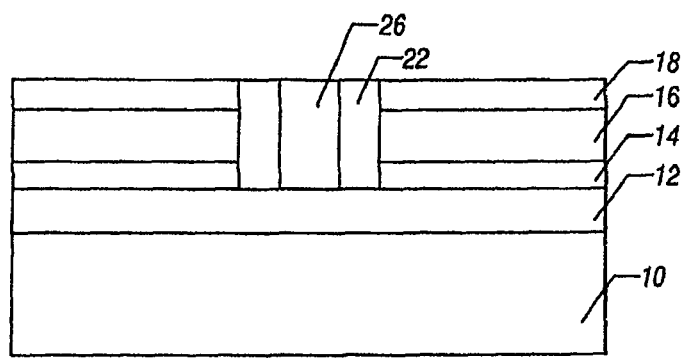
Figure 5:
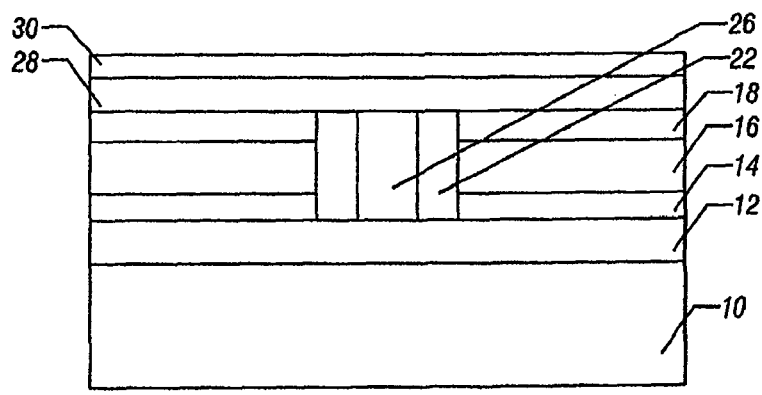

Next, in FIG. 4, a chemical mechanical planarization (CMP) is implemented to form a planarized surface. The planarization proceeds through the heater material 26 and the sacrificial dielectric 24 and stops on the third dielectric layer 18 which is here nitride. Thus, it may be understood that the third dielectric layer 18 acts as an etch stop for the chemical mechanical planarization or other etching process.

In the chemical mechanical planarization, many types of slurries may be used, which have high polish selectivity between oxide and nitride, for example. The third dielectric layer 18 acting as a chemical mechanical etch stop thus provides a high repeatability of heater height within any given wafer and from wafer to wafer.

The chemical mechanical planarization also removes the shoulders 36 (FIG. 3) of the sidewall spacers 22, resulting in the flat configuration shown in FIG. 4. Then, a chalcogenide layer 28 is deposited, followed by a conductive layer 30 which is ultimately used to form a top electrode of a phase change memory cell.

Figure 6:
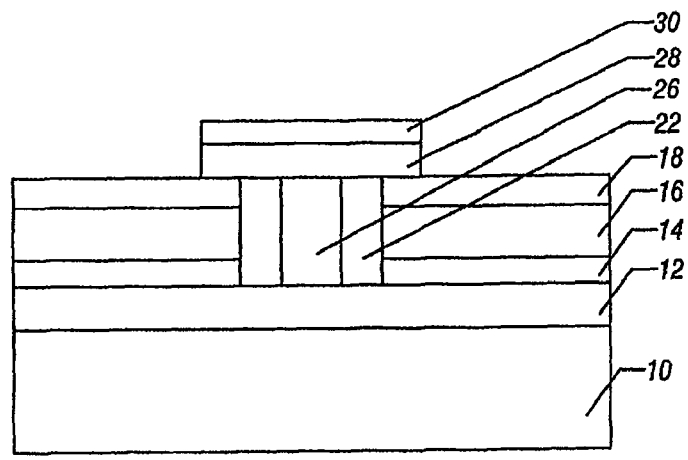

Turning to FIG. 6, the chalcogenide layer 28 and the conductive layer 30 are patterned and etched to form islands or stripes, thus forming a memory element or phase change memory device.

Figure 7:
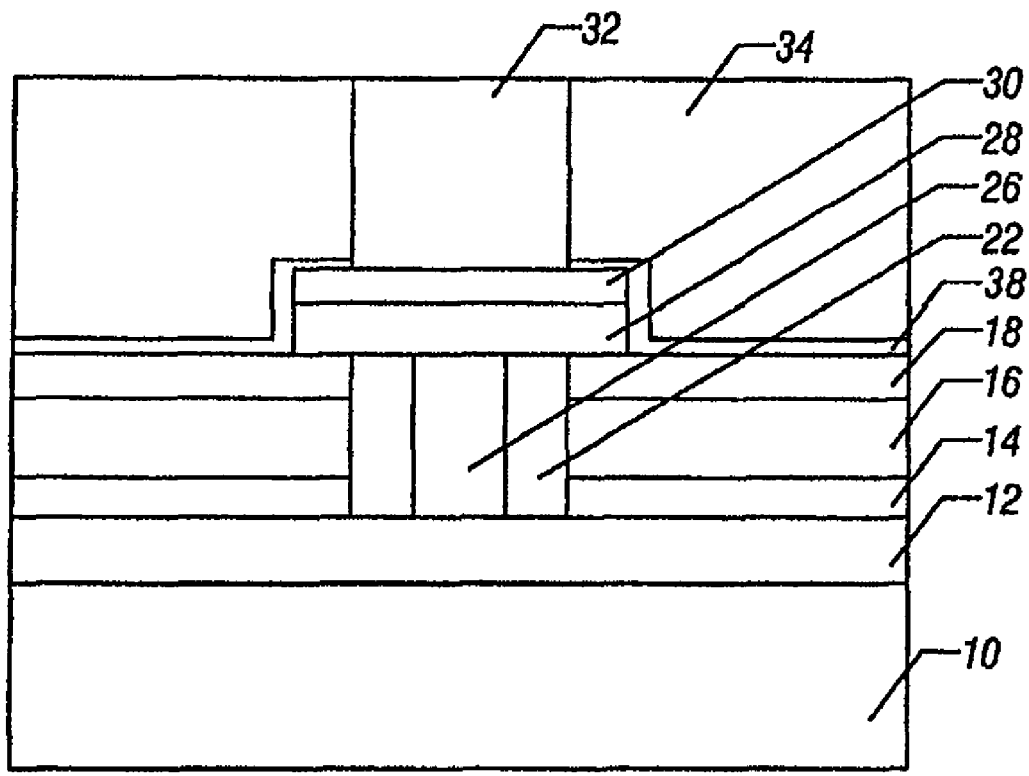

Then, in FIG. 7, an encapsulation layer 38 is formed over the stack containing the layers 30 and 28. The encapsulation layer 38 protects the sidewalls of the chalcogenide layer 28. In one embodiment, the layer 38 is formed of a low-temperature nitride. Then an insulator 34 is formed over the encapsulation layer 38 and the insulator 34 and the encapsulation layer 38 are etched to form a pore. An upper address line 32 is then deposited and formed within the pore in the insulator 34 and the encapsulation layer 38. The upper address line 32 forms, for example, a column line and is arranged generally transversely to the bottom address line 12.

In the phase change memory device of FIG. 7, since the third dielectric layer 18 is common to all of the phase change memory devices being made on a given wafer, all of the devices have a heater 26 with the exact same or least substantially the same height. That is, the use of a common third dielectric layer 18 acting as an etch stop dielectric across a number of different devices results in a common heater height.

One advantage of a common heater height is that all the phase change memory devices receive substantially the same programming current. As a result, when a phase change memory device is programmed to a given state, it will have characteristics matching those of other devices in the same state, giving greater uniformity to the overall memory array made up of a number of such devices.

A number of different arrangements may use a common etch stop layer across a number of devices of a memory array to determine a common heater 26 height. For example, instead of using the four alternating layers 14, 16, 18, and 24, only two layers may be provided, with the lower layer being formed of one material, such as nitride, and having the height which is desired for the finished heater height.

The chalcogenide layer 28 may be a phase change, programmable memory material capable of being programmed into one of at least two memory states by applying a current to alter the phase of the memory material between a more crystalline state and a more amorphous state, wherein the resistance of the memory material in the substantially amorphous state is greater than the resistance of the memory material in the substantially crystalline state.

Programming of the chalcogenide layer 28 to alter the state or phase of the memory material may be accomplished by applying voltage potentials to electrodes or address lines 12 and 32, thereby generating a voltage potential across the chalcogenide layer 28. An electrical current flows through the chalcogenide layer 28 in response to the applied voltage potentials, and results in heating the chalcogenide layer 28.

This heating may alter the state or phase of the chalcogenide. Altering the phase or state of chalcogenide layer 18 alters the electrical characteristic of the memory material, e.g., the resistance of the memory material may be altered by altering the phase of the memory material.

In the "reset" state, the memory material may be in an amorphous or semi-amorphous state and in the "set" state, memory material may be in a crystalline or semi-crystalline state. The resistance of memory material in the amorphous or semi-amorphous state is greater than the resistance of memory material in the crystalline or semi-crystalline state. It is to be appreciated that the association of "reset" and "set" with amorphous and crystalline states, respectively, is a convention and that at least an opposite convention may be adopted.

Using electrical current, the memory material may be heated to a relatively higher temperature to amorphosize and "reset" the memory material (e.g., program the memory material to a logic "0" value). Heating the volume of the memory material to a relatively lower crystallization temperature may crystallize and "set" the memory material (e.g., program the memory material to a logic "1" value). Various resistances of the memory material may be achieved to store information by varying the amount of current flow and duration through the volume of the memory material.

Figure 8:
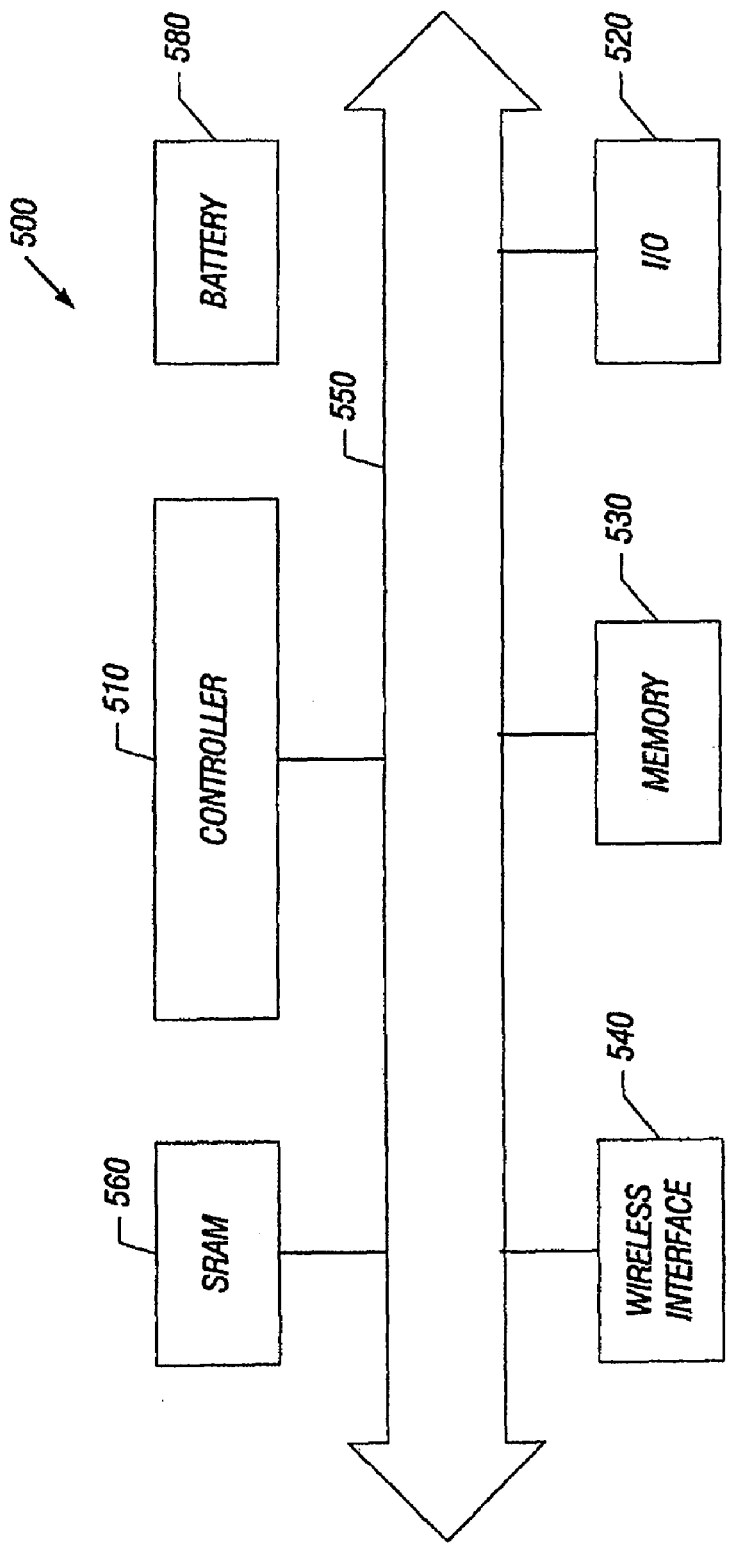
FIG. 8 is a depiction of a system incorporating the memory of FIG. 7.

Turning to FIG. 8, a portion of a system 500, in accordance with an embodiment of the present invention, is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g., a keypad, display), a memory 530, and a wireless interface 540 coupled to each other via a bus 550. The system 500 is powered by the battery 580. It should be noted that the scope of the present invention is not limited to embodiments having any or all of these components.

Controller 510 comprises, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 comprises the phase change memory having a memory array formed by the phase change devices discussed herein.

I/O device 520 may be used by a user to generate a message. System 500 uses wireless interface 540 to transmit and receive messages to and from a wireless communication network with a radio frequency (RF) signal. Examples of wireless interface 540 include an antenna or a wireless transceiver, although the scope of the present invention is not limited in this respect. A static random access memory (SRAM) 560 is also coupled to bus 550.

Finally, it is clear that numerous variations and modifications may be made to the phase change memory device and process described and illustrated herein, all falling within the scope of the invention as defined in the attached claims.

The invention claimed is:

1. A method, comprising:
    manufacturing a phase change memory device, the manufacturing including:
    forming an insulator including an etch stop layer, wherein forming the insulator includes forming said insulator of alternating layers of first and second materials;
    forming a sacrificial layer overlying said etch stop layer;
    forming a pore in said insulator, including in said etch stop layer, and said sacrificial layer;
    forming a sidewall spacer in said pore, the sidewall spacer having an upper portion laterally defined by the sacrificial layer;
    depositing a heater in said pore; and
    planarizing said heater down to said etch stop layer, the planarizing including removing said sacrificial layer and removing the upper portion of the sidewall spacer.

2. The method of claim 1, wherein forming the said sacrificial layer includes forming said sacrificial layer of oxide and forming said insulating layer includes forming said etch stop layer of nitride.

3. The method of claim 1, wherein forming the insulator includes forming said etch stop layer at a desired heater height.

4. The method of claim 1, including forming the sidewall spacer in said pore includes:
    depositing a spacer material after forming the pore; and
    anisotropically etching the spacer material.

5. The method of claim 1, including forming said sidewall spacer with a shoulder as the upper portion and removing said shoulder during said planarizing.

6. The method of claim 1, including forming a chalcogenide layer over said heater.

7. The method of claim 6, including forming said chalcogenide layer in a planar configuration in contact with said heater.

8. A method, comprising:
forming an insulator including an etch stop layer, wherein forming the insulator includes forming said insulator of alternating layers of first and second materials;
forming a sacrificial layer overlying said etch stop layer;
forming a pore in said insulator, including in said etch stop layer, and said sacrificial layer;
forming a sidewall spacer in said pore, the sidewall spacer having an upper portion laterally defined by the sacrificial layer;
depositing a core material in said pore; and
planarizing said core material down to said etch stop layer, the planarizing including removing said sacrificial layer and removing the upper portion of the sidewall spacer.

9. The method of claim 8, wherein forming the said sacrificial layer includes forming said sacrificial layer of oxide and forming said insulating layer includes forming said etch stop layer of nitride.

10. The method of claim 8, wherein forming the insulator includes forming said etch stop layer at a desired heater height.

11. The method of claim 8, including forming the sidewall spacer in said pore includes:
depositing a spacer material after forming the pore; and
anisotropically etching the spacer material.

12. The method of claim 8, including forming said sidewall spacer with a shoulder as the upper portion and removing said shoulder during said planarizing.

* * * * *